(12) United States Patent
Demiryont

(10) Patent No.: US 7,531,239 B2
(45) Date of Patent: May 12, 2009

(54) TRANSPARENT ELECTRODE

(75) Inventor: Hulya Demiryont, Indian Rocks Beach, FL (US)

(73) Assignee: Eclipse Energy Systems Inc, Saint Petersburg, FL (US)

( * ) Notice: Subject to any disclaimer, the term of this patent is extended or adjusted under 35 U.S.C. 154(b) by 405 days.

(21) Appl. No.: 11/278,643

(22) Filed: Apr. 4, 2006

(65) Prior Publication Data

US 2006/0228564 A1 Oct. 12, 2006

Related U.S. Application Data

(60) Provisional application No. 60/669,186, filed on Apr. 6, 2005.

(51) Int. Cl.
*B32B 9/04* (2006.01)

(52) U.S. Cl. ........................ 428/445; 428/450; 428/336; 428/688; 428/702

(58) Field of Classification Search ........................ None
See application file for complete search history.

(56) References Cited

U.S. PATENT DOCUMENTS

| | | | |
|---|---|---|---|
| 4,109,052 A | 8/1978 | Anderson | |
| 4,240,713 A | 12/1980 | Leibowitz | |
| 4,556,277 A | 12/1985 | Fan et al. | |
| 4,710,433 A | 12/1987 | Rowe et al. | |
| 4,940,495 A * | 7/1990 | Weber et al. | 136/256 |
| 5,296,045 A * | 3/1994 | Banerjee et al. | 136/249 |
| 5,828,117 A * | 10/1998 | Kondo et al. | 257/458 |
| 6,040,939 A | 3/2000 | Demiryont et al. | |
| 6,094,292 A | 7/2000 | Goldner et al. | |
| 6,118,572 A | 9/2000 | Kostecki et al. | |
| 6,180,030 B1 | 1/2001 | Hirai et al. | |
| 6,252,703 B1 | 6/2001 | Nakamura et al. | |
| 6,255,003 B1 | 7/2001 | Woodard et al. | |
| 6,398,985 B2 | 6/2002 | Yokunobu et al. | |
| 6,911,163 B2 | 6/2005 | Abe | |
| 2002/0114901 A1 | 8/2002 | Choi et al. | |
| 2003/0124392 A1 | 7/2003 | Bright | |
| 2003/0152803 A1 | 8/2003 | Acchione | |
| 2004/0265550 A1 | 12/2004 | Glatkowski et al. | |
| 2005/0014033 A1 | 1/2005 | Cheung et al. | |

OTHER PUBLICATIONS

Written Opinion of International Searching Authority in corresponding PCT/US 06/12523, Mailed Jul. 31, 2007.
International Preliminary Report on Patentability (PCT Chapter I), mailed Oct. 18, 2007.

* cited by examiner

*Primary Examiner*—Ling Xu
(74) *Attorney, Agent, or Firm*—David Kiewit

(57) ABSTRACT

An electrically conductive multilayer thin film structure and composition is transparent in both the visible and infrared portions of the spectrum. This multilayer film is readily deposited on a variety of substrates, including plastics, and survives such in service conditions as flexing, vibration, thermal cycling, thermal shock, ultraviolet exposure, and high humidity. The preferred films are also compatible with conventional photolithography processes.

2 Claims, 7 Drawing Sheets

| Materials | Si | Ag | Si |
|---|---|---|---|
| Monitored Thickness (nm) | 2.0 | 14.0 | 35.0 |
| Deposition Rate (nm/s) | 0.05 | 0.4 | 0.1 |
| E-beam Voltage (KV) | -10.5 | -9.5 | -10.5 |
| Background Pressure (Torr) | 8.00E-06 | 8.00E-06 | 8.00E-06 |
| Deposition Pressure (Torr) | 2.00E-05 | 2.00E-05 | 2.00E-05 |

Figure 3

TRANSPARENT ELECTRODE

CROSS-REFERENCE TO RELATED APPLICATION

This application claims the priority of U.S. provisional patent application Ser. No. 60/669,186, which was filed on 6 Apr. 2005 and which is incorporated herein in its entirety by this reference.

BACKGROUND OF THE INVENTION

1. Technical Field

The invention relates to transparent thin films that are electrical conductors. More particularly, the invention relates to conductive films that are transparent in the visible and/or infrared regions of the electromagnetic spectrum.

2. Description of the Prior Art

Transparent electrical conductors, generally configured as thin films, are widely used for purposes such as providing electrodes for electro-optical displays (e.g., LCD and electrochromic panels) and in architectural glazing that may be heat wave rejecting or that may be heated by passing electrical current through the coating to heat window glass. The art recognizes heat wave reflective and electrically conductive, substantially transparent sheets, such as glazing sheets, which include a transparent substrate and one or more sequential transparent silver layers supported by a substrate. See, for example, U.S. Pat. No. 6,040,939. The art also recognizes visibly transparent, infrared reflective sheets for use in heat reflective architectural glazing. These may comprise a transparent solid substrate and one or more sequential transparent gold-clad silver layers supported by a substrate. An example of such a film sandwich has been described by the inventor in U.S. Pat. No. 6,255,003.

It is also known to make coated articles of manufacture that comprise a substantially transparent substrate with a silver-based substantially transparent dual-function coating on a surface of the substrate. See, for example, U.S. Pat. No. 6,040,939. Other types of heat wave reflective and electrically conductive transparent conductive oxides (hereinafter TCO). TCO coatings are wide band gap oxides that do not include silver or other metal layers. The art further recognizes that both silver-based and TCO type transparent electrically conductive coatings are only transparent in the visible spectrum and are highly reflective in the infrared (IR) spectral region. TCO substances include, but are not limited to mixtures of indium oxide doped with tin [$In_2O_3$:Sn] which is commonly referred to as ITO and which may comprise less oxygen (generally referred to as ITOx); and zinc oxide doped with aluminum [ZnO:Al], which is commonly referred to as ZAO.

The prior art provides layers evidencing two patterns, the single system layered: oxide-silver-metal buffer-oxide; and the split system layered: oxide-silver-metal buffer-oxide-silver-metal buffer-oxide. Specifically, U.S. Pat. No. 6,040,939 follows this pattern, using silicon as the semiconductor buffer layer. Within these layered structures, the oxide layers provide important anti-reflective (AR) functions. The important properties of AR coatings include transmittance enhancement and protection of the silver layer. High electrical conductance requires minimal electron scattering loss at the interfaces of conductive film. Therefore, electron scattering must be minimized through implementation of non-scattering interfaces at both sides of the silver film. Moreover, what is not known in the art is the provision of a visual and/or infrared transparent electrical conductor. It would therefore be advantageous to provide a visual and/or infrared transparent, electrically conductive thin film system.

Optical systems are sometimes provided with an electrically heated window in order to dispel condensed moisture—i.e., as a defroster. For visible light systems this can be provided by means of a transparent conductive film. Infrared optical systems would be well served by the availability of an infra-red transparent, electrically conductive film.

SUMMARY OF THE INVENTION

One aspect of the invention is that it may provide a thin film electrical conductor with a high transparency in the visible and infrared regions of the spectrum. Preferred embodiments of the invention demonstrate optical transparency of greater than fifty percent for substantially all wavelengths between 400 nm and 25 microns. This transparency is paired with measured sheet resistance values of between three and 100 Ohm/sq.

A particular preferred embodiment comprises a multilayer thin film having an optical transparency of at least fifty percent for all wavelengths between 400 nm and 25 microns and an electrical sheet resistance of no more than 100 ohms per square. This film is deposited on a substrate and comprises an adhesion-enhancing, optical-matching layer deposited directly on the substrate. This adhesion-enhancing, optical-matching layer preferably comprises silicon and has a thickness of not more than 60 nm. The adhesion-enhancing optical-matching layer may substantially reduce substrate/silicon interface reflection. In this embodiment a metallic conduction layer is deposited on the adhesion-enhancing, optical-matching layer and comprises silver, gold, copper or aluminum and has a thickness of at least three and not more than 60 nm. An overcoat layer deposited on this metallic conduction layer preferably comprises silicon and has a thickness of at least three and no more than 120 nm. In other preferred embodiments, the sandwich structure may comprise additional metallic conduction layers interleaved with additional overcoat layers. If the adhesion-enhancing layer does not have optical matching functions, a transparent electrode of this invention may be highly reflective in the IR region.

In some embodiments, the invention provides a transparent thin film conductor deposited on a substrate and comprising an adhesion-enhancing, optical-matching layer deposited on the substrate; a first metallic conductive layer comprising a first selected metal deposited directly on the adhesion-enhancing, optical-matching layer; a semiconductor layer deposited on the first metallic conduction layer; a second metallic conductive layer comprising a second selected metal deposited directly on the adhesion-enhancing, optical-matching layer; and an overcoat layer deposited on the second metallic layer. In multilayer films of this sort each of the metal layers has a respective thickness selected to be at least one half of an associated IR opacity threshold thickness. In both cases the opacity threshold thickness is characterized in that all films of the relevant material thicker than the opacity threshold thickness are opaque to infrared radiation. Those skilled in the thin film arts will appreciate that the opacity threshold may vary with film formation conditions. If this is the case, it is to be understood that the relevant opacity threshold thickness and the associated metallic conduction layer thickness are made by the same measurement method on films deposited under substantially the same conditions.

Yet another aspect of the invention is that it provides, among other things, a transparent multilayer thin film conductor deposited by a selected deposition process on an insulating substrate and comprising two metallic conductive layers separated by a semiconductor layer. In particular, each of the metallic layers consists of substantially the same metal, and has a common metal thickness measured by a chosen thickness measurement method. This common metal thickness is selected so that each of the layers is transparent. Moreover, each of the films has substantially the same nominal sheet resistance measured on a test film of the same material deposited on an insulating substrate by the selected deposition method and having the common metal thickness when measured by the chosen thickness measurement method. In films of this sort the semiconductor layer has a thickness selected so that the semiconductor layer is transparent and so that a sheet resistance of the multilayer thin film conductor is less than one half of the nominal sheet resistance of either of the metal films.

Another aspect of the invention is that preferred embodiments provide an electrically conductive, optically transparent coating which can be optimized for visible and/or infrared transmittance and which can be coated onto either rigid or flexible substrates. These coatings can exhibit excellent flexibility and are not brittle. The conductors formed according to the invention typically exhibit between three and five Ohm/sq sheet resistances and approximately 90% visible and infrared transmittance. The films have exhibited high environmental durability and are appropriate for use in photolithographic processes.

BRIEF DESCRIPTION OF THE DRAWINGS

FIG. 3 is a table of deposition parameters used to form a silicon/silver/silicon (Si/Ag/Si) multilayer film.

DETAILED DESCRIPTION OF THE INVENTION

Figure 1:
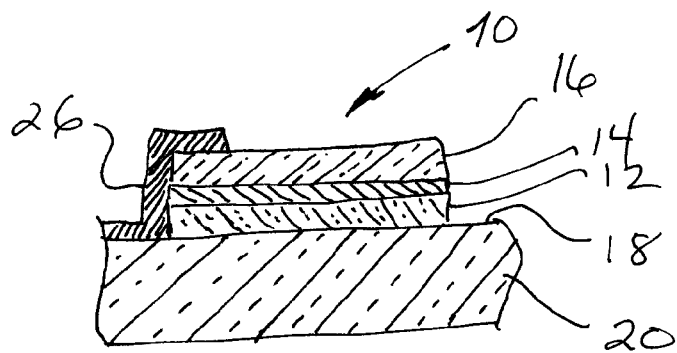
FIG. 1 is a schematic cross-sectional view of a first embodiment of a transparent electrode system according to the invention, wherein the thicknesses of various layers are not to scale.

As depicted in FIG. 1, a first embodiment of the multilayer film 10 of the invention comprises three thin film layers 12, 14, 16 deposited on a suitable supporting surface 18, which may be a surface of a bulk insulating substrate 20. A first of these layers 12 is an adhesion-enhancing, optical-matching layer deposited directly on the supporting surface 18. In a preferred embodiment this layer may be made of silicon for visible light applications, and for IR applications would depend on the choice of the substrate 20. A second layer 14, deposited on top of the adhesion layer 12, is a metallic conductor. Finally, in this embodiment, a UV-inhibiting, transparency-enhancing and protective overcoat 16 is deposited on the metallic conductor 14. In a preferred embodiment for use with visible light, the overcoat may be a five to thirty five nanometer (nm) graded layer of silicon to silicon oxide that has a composition graded from silicon adjacent the metallic conductor to silicon dioxide at the free surface, that is, the oxidation level of the silicon increases with distance from the metallic film. For use with both visible and infra-red radiation, this layer may be a thirty five nm to forty nm layer. A single electrode film of this sort may be referred to hereinafter as being a Si/Ag/Si film.

Figure 2:
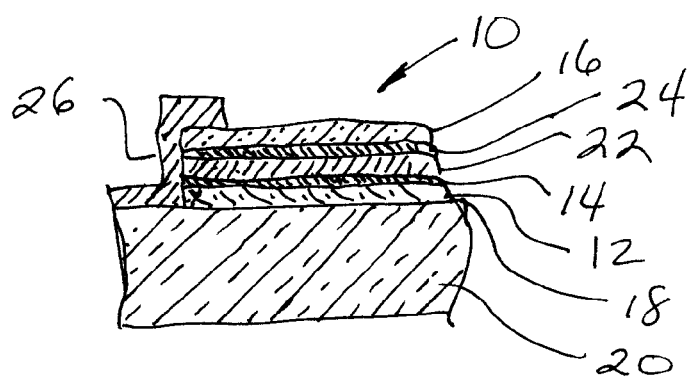
FIG. 2 is a schematic cross-sectional view of a second embodiment of a transparent electrode system according to the invention, wherein the thicknesses of various layers are not to scale.

In another significant embodiment, hereinafter sometimes referred to as a 'split-electrode' film and schematically depicted in FIG. 2, the overall film 10 comprises an adhesion enhancing optical matching layer 12 deposited on a supporting surface 18. A first metallic conductor 14 is deposited directly on the adhesion enhancing layer 12. A semiconductor layer 22 (which may be silicon) is then deposited on the first metallic conductor 14 and a second metallic conductor 24 is deposited on the semiconductor 22. Finally, an overcoat layer 16 is deposited on the second metallic conductor 24. In a particular preferred embodiment the adhesion enhancing optical matching and semiconductor layers are both silicon, the first and second metallic conductor layers are both silver and the overcoat comprises silicon and may have the same sort of graded structure as discussed above with respect to the first embodiment. A split electrode film of this particular sort may be referred to hereinafter as being a Si/Ag/Si/Ag/Si film.

In order to fully utilize the electronic conduction properties of the various films of the invention, one generally provides a contact metal layer on top of selected portions of the overcoat. This is preferably provided by depositing the contact metal layer 26 on the entire free surface of the overcoat layer and then photolithographically defining the desired contact regions (e.g., adjacent the edges of a display panel). Inasmuch as many of the preferred embodiments of the invention use a graded silicon to silicon oxide film as the overcoat layer. Moreover, many different metals and alloys can be used to form the contact layer. These comprise, but are not limited to, aluminum, silver, nickel, and nickel-chromium alloy films. Moreover, it will be appreciated that other approaches, such as deposition of the contact metal through a deposition mask (not shown), can be considered for providing an appropriately patterned contact.

In order to utilize the transparency of the various films of the invention, the substrate 20 is usually selected to be transparent in whatever wavelength region is important for a specific application, although in some applications radiation may be reflected at the substrate so as to pass through the multilayer film of the invention twice. Inasmuch as the multilayer film structure of the invention can provide transparency in excess of 50% for all wavelengths lying between 400 nm and 25 microns, the substrate is selected to be transparent for at least a selected range of wavelengths within that broader region.

The adhesion-enhancing, optical-matching layer material selected depends on the substrate utilized. In order to eliminate reflectance from the substrate-transparent electrode interface, a graded index coating or optical matching coating is appropriate. For applications in the visible portion of the spectrum (e.g., displays) the substrate may be a glass, such as a borosilicate glass, or a plastic, such as polyethyleneterephtalate (PET), polyimide, or any other transparent plastic. For applications in the infra-red portion of the spectrum the substrate may be made of many suitable materials known to be transparent in the spectral region of interest. Materials of this sort include, but are not limited to, silicon, germanium, zinc sulfide, and zinc selenide.

For many of the embodiments described in the examples that follow this general discussion, the adhesion enhancing optical-matching layer is a silicon-containing film having a thickness no more than sixty nm with a preferred thickness no more than three nm for both visible and IR transparent conditions. It may be noted that the invention is not limited to the use of silicon, and, in fact, one of the experimental examples used germanium for this purpose. In order to eliminate reflectance from the substrate-transparent electrode interface, a graded index coating or a matching coating system is employed in preferred embodiments. Thus, in some embodiments, e.g. where silicon is used as the substrate, the adhesion-enhancing optical-matching film is a graded silicon-oxygen film in which the silicon to oxygen composition ratio varies between the substrate and the metallic conduction film. Correspondingly, in systems used in the infra-red region of the spectrum where a zinc chalcogenide (e.g., ZnS or ZnSe) is used as the substrate, the adhesion-enhancing optical-matching layer may comprise concentrations of the zinc chalcogenide that vary with distance between the substrate and the metallic conduction film.

In a preferred embodiment, silver is selected as the metallic conduction film and a preferred metal (silver) thickness for visible and IR transparent electrodes is 14.0 nm. Actual effective metallic thickness can be calculated from measured sheet resistance of transparent electrical conductors, which indicates that a metal-semiconductor-oxide graded effective medium forms on the silver layer.

The metallic conductive layer or layers 14, 24 may comprise any of a number of metals, such as silver, gold, aluminum, or copper. In experimental work to date, and in the specific examples discussed below, silver has been used with a thickness that is preferably at least three nm and preferably less than sixty nm.

The transparency-enhancing protective overcoat layer 16 can be made of silicon, having a composition that ranges from silicon to silicon dioxide. For example, if this overcoat is approximately thirty five to forty nm in total, it may comprise an interior silicon layer that is about ten nm thick, a silicon monoxide layer that is about ten nm thick, a graded oxide region that is about ten nm thick and an exterior layer of substantially pure silicon dioxide that is about ten nm thick.

Although it may be possible to form multilayer film structures of the invention in a variety of ways, the multilayer films described in the following examples were all formed by electron-beam deposition on substrates that had been wet-cleaned, spin-dried and subject to a five minute argon ion cleaning prior to deposition. The samples were prepared in a multi-station vacuum coater having a background pressure prior to deposition of two microTorr. Deposition rates, as measured by a quartz crystal monitor, varied. An exemplar set of deposition conditions are tabulated in FIG. 3. In particular preferred cases, silicon was deposited at a rate of 0.1 nm/sec and silver was deposited at 0.4 nm/sec.

Various embodiments of the invention may have optical visible applications including, for example: low-e film for heat wave rejection, electrodes for displays, and optical IR applications, and is also applicable to electrical applications, including electric field applications, such as to displays and electron interaction, for example, with regard to electro-chromic devices. The invention provides a flexible transparent conductor for displays, for example, or a heat mirror type plastic insert or direct deposit on glass for windows in architectural or automotive applications. The invention can also comprise a transparent electrode for IR devices, and may be used in solar panels, spacecraft or satellite thermal control variable emittance systems, and on spacecraft surfaces as a protective coating for electrical charging. Those skilled in the art will appreciate that many other applications of the invention are possible.

Those skilled in the art will also appreciate that many other processes, such as the use of a resistively heated source, or sputtering, could be used for the deposition. Moreover, different choices of the background pressure, substrate-to-source distance, deposition rate, and substrate temperature could be used. Inasmuch as the morphology of very thin films of the sort used in the present invention are dependent on deposition conditions, those skilled in the thin film arts will also appreciate that different deposition processes could be used to form multilayer films equivalent to those herein described, but that demonstrate the desired optical and electronic properties at somewhat different nominal values of film thickness.

Prior to making optical and electrical measurements on the deposited films described in the following examples, the adherence of each film to its substrate was assessed by a conventional cellophane tape stripping test. In all cases reported in the following examples the tape test showed excellent adhesion.

EXAMPLE 1

Transmission, UV-Inhibition, and Electrical Resistance of a Composite Having a Single Metal Film Electrodes designed in a manner consistent with the invention exhibit two important properties: optical transparency and electrical conductance. The optical properties are increased light transmission (transparency) coupled with increased UV-inhibition. The conductive property of the transparent electrode is decreased electrical resistance. Optical properties vary depending on the thicknesses of the silicon and silver layers of the electrode; whereas conductive properties are only dependant on the thickness of the silver layer. Tests were performed to determine the optimal thicknesses of the silver and silicon layers associated with the highest level of transmission, UV-inhibition, and electrical conductivity.

Consistent with energy conservation principles, the incident energy (or input energy) is equal to the combined total of reflectance, transmission, and absorption, where, for a constant level of absorption, increasing reflectance corresponds to reducing transmission. Below 450 nm the absorption is UV-inhibition. The desirable qualities obtained by use of this invention are increased transmission (reduced reflectance) and increased UV-inhibition (absorption) when compared to prior art electrodes.

A set of samples were prepared on both aluminum-coated polyimide and glass substrates to identify the thickness of the silver layer providing the desired IR transparency and high electrical conductivity. The films deposited on the polyimide/aluminum substrate were used to evaluate the IR transparency of the coatings by comparing the FTIR reflection spectra of aluminum versus that of the Al/Si/Ag/Si film system. Aluminum, when isolated from the electrode claimed in this invention, is opaque (100% reflective). When attached to the transparent electrode claimed in this invention, the aluminum substrate becomes more reflective. The films deposited on glass substrates were used to determine both the electrical conductivity and the visible transmission spectra of the coating system. Glass is an ideal substrate for electrical conductivity measurements because it is a complete insulator (100% electrically resistant).

In this example, the IR transparent electrode coating was a three-layer film (Si/Ag/Si), where a first silicon adhesion layer was directly deposited on a selected substrate, then a silver conductor film was deposited on top of the silicon film, and finally a silicon overcoat film was deposited on the silver film. For all of the samples, the first and top layers of silicon film were 2 nm and 30 nm thick, respectively. The silver layer thickness was no more than 30 nm.

The thicknesses of deposited films described in this and other examples were measured by a Tencor Alpha step 500 profile-meter made by the KLA-Tencor company. Those skilled in the thin film arts will appreciate that other sorts of thickness measurement approaches are well known and could equally well have been used.

Optical measurements on deposited films described in this and other examples were made with two different instruments. In the visible region of the spectrum, transmittance measurements were made with an Ocean Optics spectrophotometer, and transmittance measurements in the 380 nm to 2200 nm region were made with a Perkin Elmer Lambda 9 UV-vis-near IR spectrophotometer. The IR reflection measurements were made with a Perkin-Elmer FTIR spectrophotometer which yielded data in the spectral region from 1.3 to 27 microns. In the infra-red region of the spectrum the reflectance was determined from the difference between a reflectance curve measured for a multilayer film of the invention that was backed by an aluminum film and a reflectance curve measured for a bare aluminum film, where both of the aluminum films were deposited on the same sort of substrate—e.g., polyimide. The aluminum film was thick and opaque.

The electrical sheet resistance of the deposited films was determined by a conventional four point probe measurement that yielded results in units of Ohms per square (hereinafter Ohm/sq).

Figure 4:
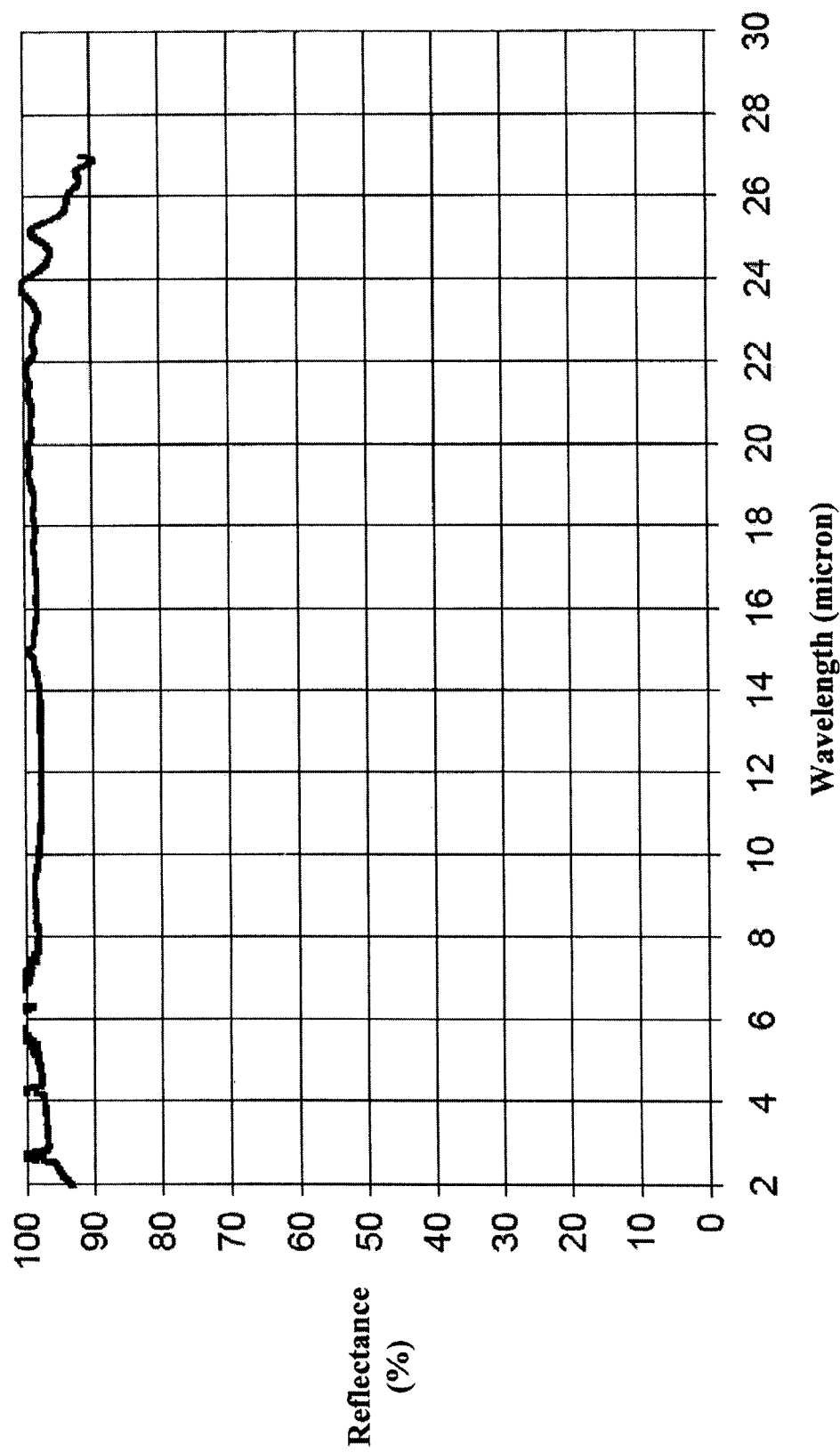
FIG. 4 displays FTIR reflectance spectra for a multilayer film deposited on an aluminum surface, the film having a 14 nanometer (nm) thick silver layer with 3.0 ohms per square sheet resistance.
Figure 5:
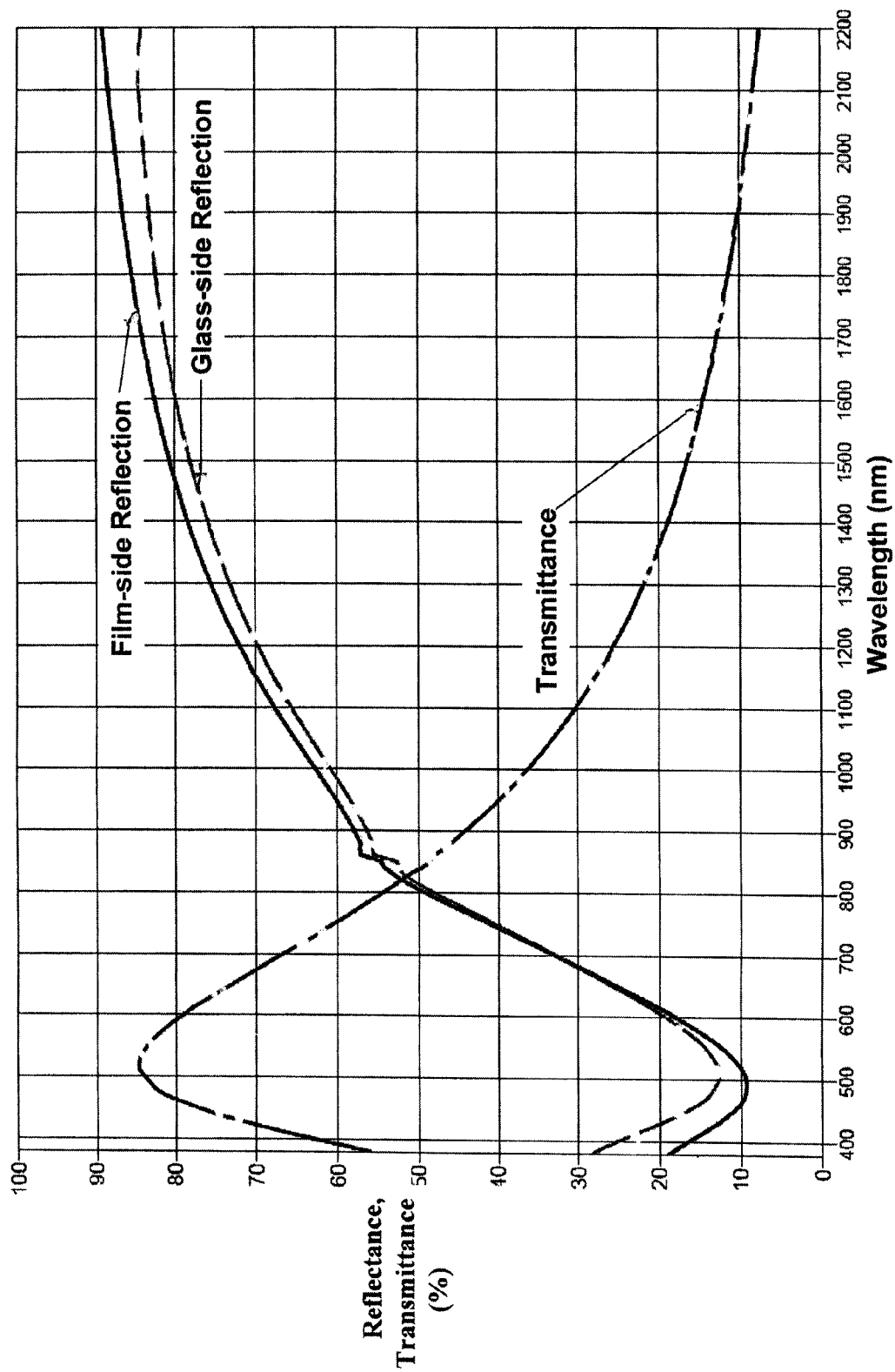
FIG. 5 shows visible transmittance and reflectance spectra of a multilayer film deposited on a non-dispersive glass (BK7) substrate, the film comprising a 14 nm thick silver layer and having a sheet resistance of 3.0 Ohm/sq.

The results of this study indicated, not surprisingly, that the thicker the silver film, the higher the electrical conductivity. FTIR reflectance data, taken from a sample having a 15 nm thick silver layer with 2.6 Ohm/sq sheet resistance, are plotted in FIG. 4. The measured IR reflectance of the system is 98.5% in the evaluated spectral region. FIG. 5 shows visible-near IR reflectance and transmittance spectra of the same sample on glass. The transmittance data display a peak value of 85% and a minimum value of 7% at 2200 nm. Film side and glass side reflectances exhibit minima at around 500 nm. The fact that the film side minimum is less than the glass side minimum indicates the AR properties of the protective overcoat of the film. As previously noted, if the adhesion-enhancing layer does not have optical matching functions, a transparent electrode of this invention may be highly reflective in the IR region. As can be seen, the sample used in FIG. 5 did not have optical-matching functions; therefore, high reflectance occurred in the IR region.

It is important to note that glass is absorbing (opaque) in the IR region. Therefore, optical experimental results of the transparent electrode system are inhibited by the use of a glass substrate in the IR region. The optical results utilizing a glass substrate are only expressive of the transparent electrode system in the visible spectra.

Non-UV-inhibition of the coating can be observed at 800 nm, where almost no absorption occurs. High optical absorption, approximately 20%, occurs at shorter wavelengths, as shown in FIG. 5 at 400 nm. Low optical absorption of the silver layer, approximately 3%, is observed at wavelengths above 500 nm.

Environmental tests were performed on the same samples to assess the UV-inhibition optical properties of the transparent electrode. Testing equipment was an Atlas Ci3000 FadeOmeter. This equipment provides accelerated environmental tests which are UV; humidity, and temperature. A total of 16 samples, 8 on polyimide and 8 on PET, were evaluated in the test station. Test conditions consisting of: 95% humidity, high level UV, and 55° C. temperature, were held constant for 150 hours. Samples passed these extreme conditions without changing their original performances. Results indicate the environmental stability of the transparent electrode of this invention.

EXAMPLE 2

Investigation of a Ge/Ag/Ge System for Infrared Applications

In this example, the IR transparent, electrically conductive film consisting of germanium (Ge) and silver was layered in a Ge/Ag/Ge configuration, where the layer thicknesses were 15 nm/14 nm/50 nm, respectively. The film was simultaneously deposited both on glass and polyimide/aluminum substrates. Sheet resistance of the film on glass was measured as 8 Ohm/sq. The photopic visible transmittance was measured as 1.5%. Average IR reflectance of the system was around 95%.

Both IR transmittance and electrical conductance of the Ge/Ag/Ge system were inferior to comparable Si/Ag/Si films. Adhesion of Ge/Ag/Ge film system on the glass substrate was measured by a tape test and was found excellent.

EXAMPLE 3

Effects of Changing the Adhesion and Overcoat Composition

In this example, indium tin oxide deposited without oxygen control ($ITO_x$) buffer layers were used as adhesion-enhancing, optical-matching and overcoat-protecting layers, where the chemical composition of the source material of the $ITO_x$ film was 10% tin oxide ($SnO_2$) and 90% indium oxide ($In_2O_3$), which was deposited by e-beam without using ion assisted deposition. In addition, a tungsten trioxide ($WO_3$) layer was used as an oxygen source during deposition to measure the protection offered by the overcoat. The coating order of the IR transparent electrode was $ITO_x$/Ag/$ITO_x$/$WO_3$. The film thicknesses of first $ITO_x$ and silver layers were kept constant at 2 nm and 15 nm, respectively. The thickness of the $WO_3$ layer was 40 nm, which provides an AR coating for $ITO_x$/Ag/$ITO_x$ film system. The thickness of the second buffer layer lying on silver film was no more than 3 nm.

This example demonstrates that, while ITO provides maximum transmittance and minimum sheet resistance, $ITO_x$ displays lower transmittance and higher sheet resistance. When no $ITO_x$ overcoat was used, the measured film resistance was infinite. When the $ITO_x$ overcoat was at least seven nm thick, it protected the silver layer during deposition of the 40 nm thick $WO_3$ film. The resistance of the protected multilayer films was measured as 4.8 Ohm/sq. The FTIR reflectance spectrum of the samples deposited on polyimide/aluminum was measured as 96%. The visible photopic transmittance was around 80%. Comparable results were obtained when a silicon layer was used as the adhesion-enhancing, optical-matching layer.

EXAMPLE 4

Anti-reflective Properties of a Silicon Overcoat in a Si/Ag/Si Film

In this example, a Si/Ag/Si film was deposited on both glass and polyimide substrates. In this series of experiments the thickness of the first, adhesion-enhancing, optical-matching, silicon film was held constant at 2.5 nm and that of the silver layer was held constant at 16 nm. The thickness of the silicon overcoat, however, was varied between 30 and 60 nm.

The electrical resistance of the films in this series varied between 2.6 and 3.5 Ohm/sq. Resistance is affected by the thickness of the silver layer, but it is unaffected by the thickness of the silicon layer, which only alters optical transparency.

Figure 6:
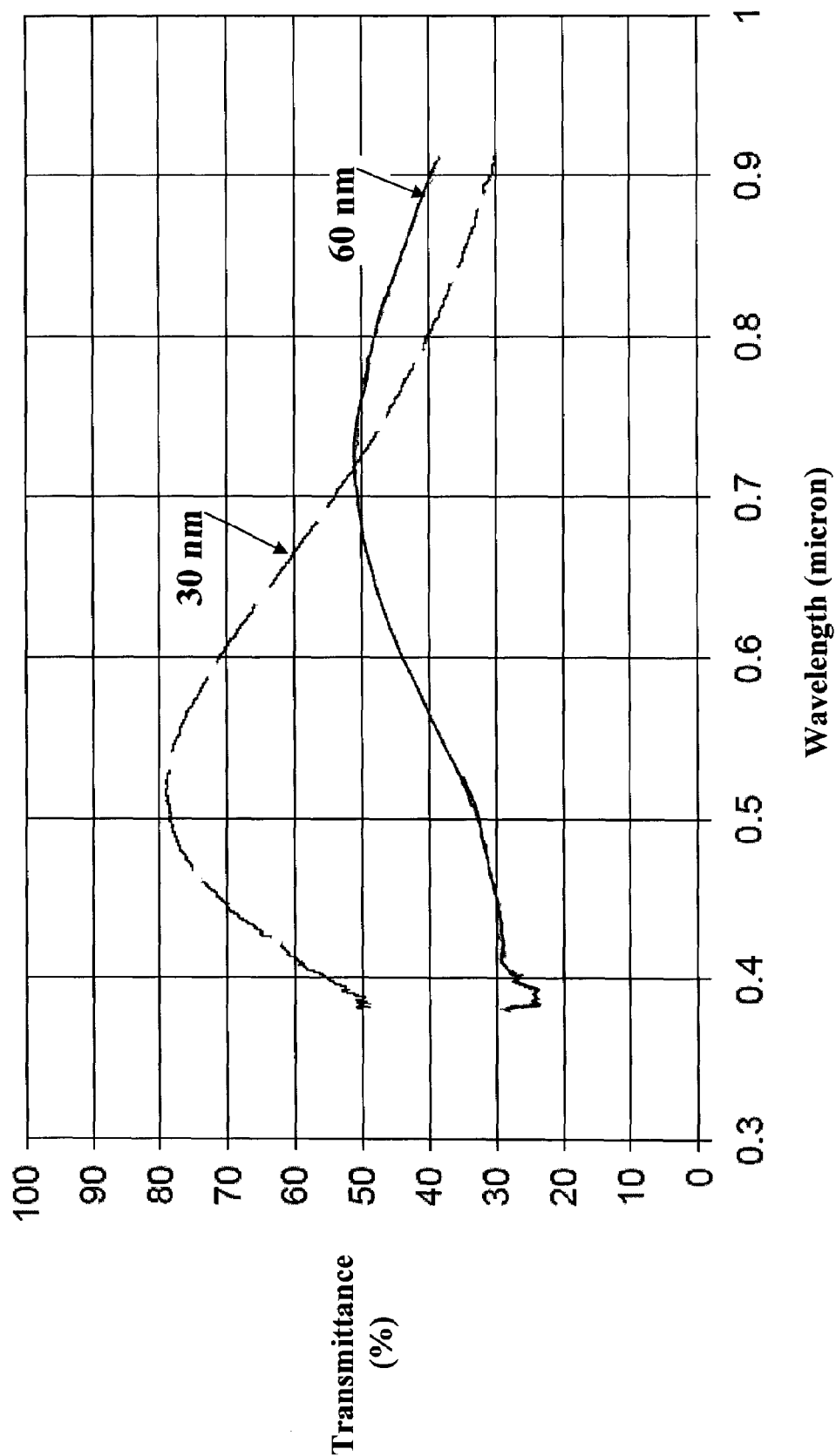
FIG. 6 shows visible transmittance spectra of glass/Si/Ag/Si films having top silicon thicknesses of 30 nm and 60 nm, respectively.

FIG. 6 depicts the visible transmittance spectra of a glass/Si/Ag/Si arrangement having silicon overcoat thicknesses of 30 nm and 60 nm, which provide 77% and 38% visible transmittance at 550 nm. The glass/Si/Ag/Si system for the 2.0 nm/1.0 nm/35 nm film provides 85% visible transmittance. Optical measurements on a range of samples indicated that a preferred anti-reflection film thickness of silicon for silver is 35 nm for both visible and IR regions. The FTIR spectra of the samples indicate a higher reflectance (105%) for silicon film 30 nm thick and lower reflectance (97%) for a silicon film that is 60 nm thick.

EXAMPLE 5

Study of a Split-electrode Si/Ag/Si/Ag/Si Structure

A series of Si/Ag/Si/Ag/Si films were deposited on a glass substrate. All of the samples had a 2 nm adhesion enhancing optical matching silicon layer and a ten nm silicon overcoat. In addition, the thicknesses of both silver films was selected to be ten nm for all samples. The single variable was the thickness of the central semi-conducting layer, which varied between 3 and ten nm.

Electrical measurements on this series of multi-layer films indicated the lowest sheet resistance of three Ohm/sq was found for samples having a four nm central silicon layer. Increasing the central silicon thickness to ten nm raised the sheet resistance to six Ohm/sq. Decreasing the central silicon thickness to three nm raised the sheet resistance to seven Ohm/sq.

By comparison, a reference sample having a single ten nm silver layer had a sheet resistance of ten Ohm/sq. If the two silver films in the present split electrode structure had been separated by a film that carried no current, one would expect that sheet resistance measurement of five Ohm/sq—i.e., the resistance of two ten Ohm/sq films connected in parallel. The value measured for the optimal thickness semiconductor layer, however, is less than this, indicating that the semiconductor layer carries at least some of the current.

Optical measurements in the visible and infrared for the optimal split electrode structure were made for a multilayer film comprising two ten nm silver films and, for comparison purposes, on a comparable Si/Ag/Si film comprising a single ten nm silver film. These measurements indicated that although the split electrode configuration provides acceptable transparency of about 60% at a wavelength of 550 nm, the comparable single-conductor film provides transparency of about 80% at the same wavelength. Therefore, the split system provides both lower resistivity and transmittance, while the single-silver system exhibits higher resistivity and higher transmittance. The split system may be utilized where conductivity is of greater importance, and the single-silver system may be utilized where transparency is of greater importance.

EXAMPLE 6

Figure 7:
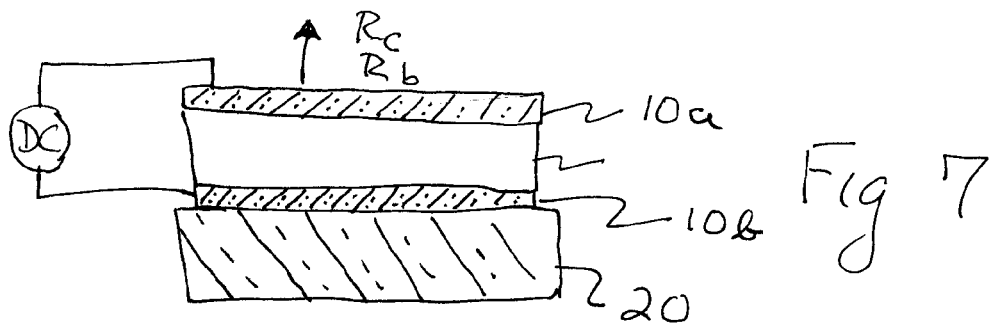
FIG. 7 is a schematic depiction of an electrochromic device used to study transmission in exemplar multilayer films.

Use of Electrochromic Structures to Demonstrate Visible and IR Transmittance for Multilayer Films of the Invention In this example visible and IR transparent conductive coatings of the invention were used as electrodes of an electrochromic device (ECD) depicted in FIG. 7, where an ECD structure 28 is built using two multilayer transparent electrodes of the invention 10a, 10b. As is known in the art, an ECD comprises two electro-chromically active layers separated by an electrolyte layer. The ECD can be switched between a bleached (transmitting) and a colored (absorbing) state by application of an appropriate DC voltage. In the simplified depiction of FIG. 7, the ECD comprises the two electrodes 10a, 10b of the invention and the other layers, which are depicted as a single element for clarity of presentation.

This example shows the electron interaction between the two active layers of an ECD and two transparent electrodes, where one electrode is transparent in both the visible and the IR regions and the other is transparent in the visible region but mirror-like reflective in the IR region.

In a particular embodiment used in the present example, the lower electrode 10b (i.e., the electrode adjacent the substrate 20) comprised an Si/Ag/ITO$_x$ structure where the silicon layer was in contact with the supporting surface and the ITO$_x$ layer was in contact with the ECD structure 28. The thicknesses of these layers were 2 nm (Si)—24 nm (Ag)—30 nm (ITO$_x$), which resulted in a structure that was transparent in the visible, but that had a mirror-like reflectivity in the IR. In this embodiment, the upper electrode 10a (distal from the substrate) comprised Si/Ag/ITO layers, where the ITO layer was in contact with the ECD structure; and silicon was the top most layer. Thicknesses of these layers were 35 nm (Si)—12 nm (Ag)—30 nm (ITO), which provided a multilayer electrode that was transparent in both the visible and the IR.

Figure 8:
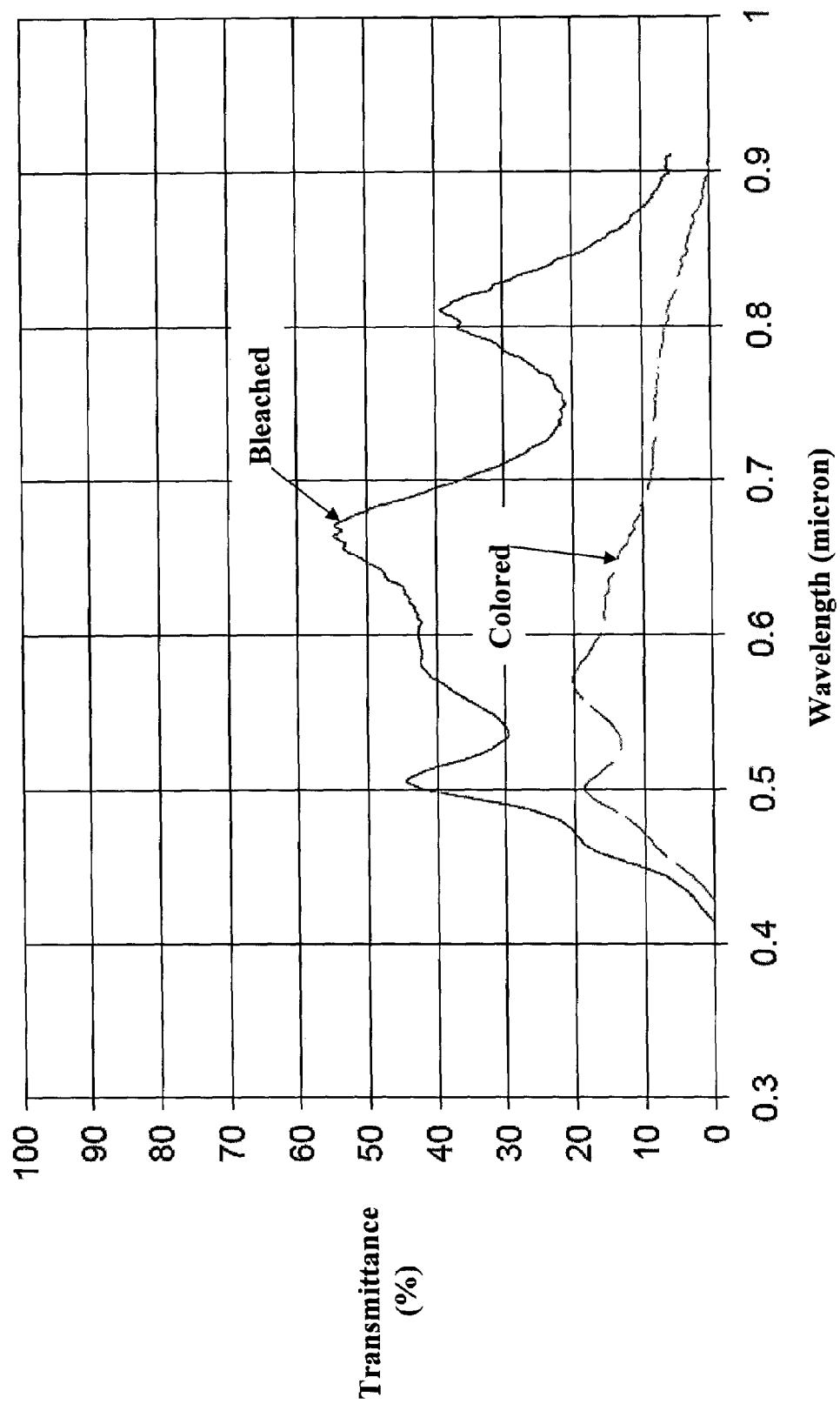
FIG. 8 depicts visible transmission for an exemplar electrochromic device in both bleached and colored states.

Visible measurements on the exemplar structure were made by transmitting light through the ECD and the substrate. The results, shown in FIG. 8, depict both bleached and colored states, which are voltage-controlled. The ECD bleaches and becomes more transparent when the electrodes' polarity is reversed. The variation of transmission with ECD state demonstrates the transparency of both electrodes 10a, 10b in the visible portion of the spectrum.

Figure 9:
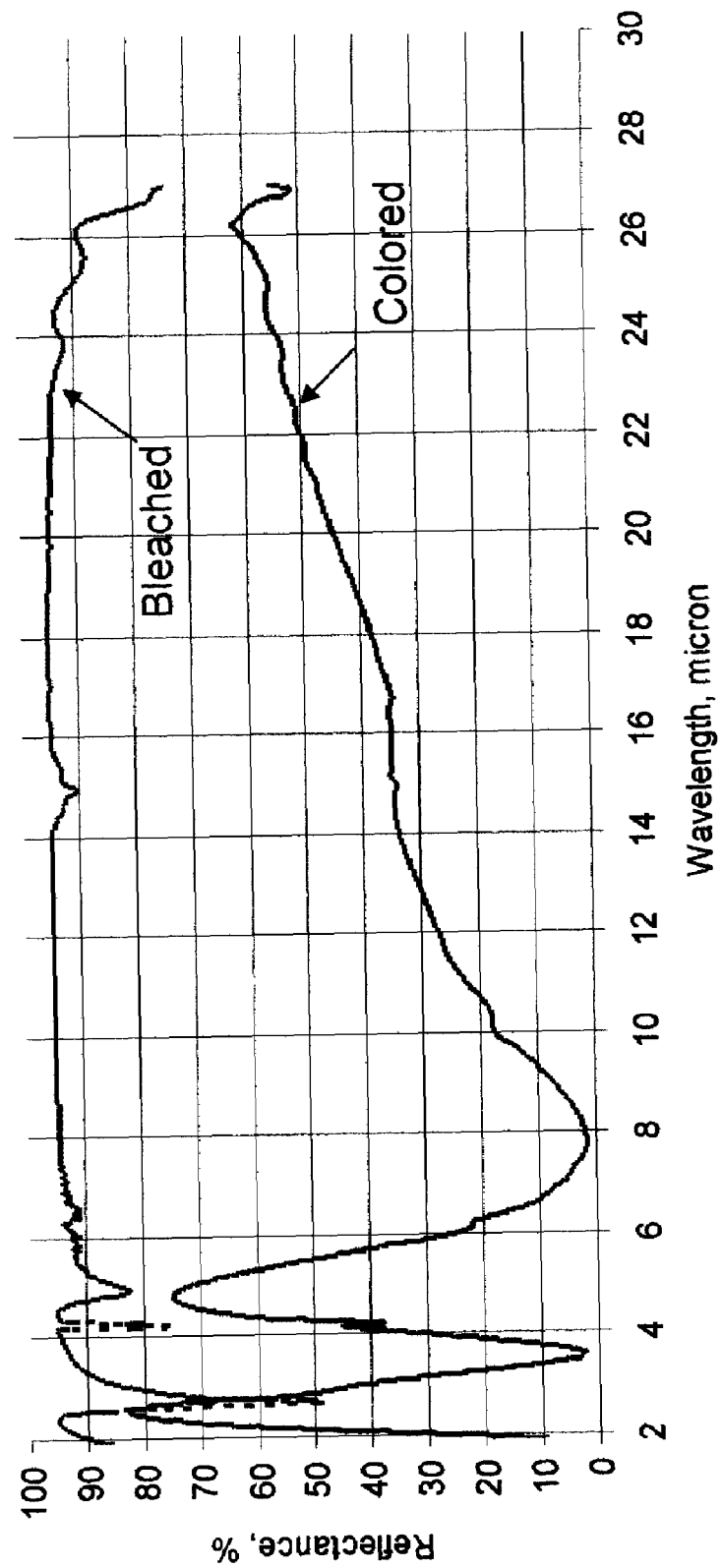
FIG. 9 shows FTIR reflectance spectra of the same ECD as those shown in connection with FIG. 8.

Infrared measurements on the exemplar structure were made in reflection, in which incident IR radiation passed through the upper electrode and the ECD, was reflected from the lower electrode 10b and passed again through the ECD and upper electrode 10a. Reflection spectra of the colored and the bleached sample were obtained with a Perkin-Elmer FTIR model 2000 spectrometer and are plotted in FIG. 9 The bleached state reflectance of the ECD is around 95% in the entire spectral region extending from 2 microns to 26 microns. This indicates that double pass total absorption of the transparent electrode-ECD system (bleached case) is around 5%. Since the transparent electrode is passive, it stays 95% transparent. The only change observed on reflectance is the absorption effects of the ECD. When the coloring voltage was applied to the electrodes, the system became absorbing and IR light was absorbed by the ECD so as to decrease reflected light intensity. This example also shows that the lower electrode 10b can also be used as an IR mirror by increasing silver thickness in the multilayer film.

Although the invention is described herein with reference to various embodiments, one skilled in the art will readily appreciate that other embodiments may be substituted for those set forth herein without departing from the spirit and scope of the invention. Accordingly, the invention can only be limited by the Claims included herewith.

I claim:

1. A multilayer electrically conducting thin film having an optical-transparency of at least 50% for at least a selected band of wavelengths between 400 nm and 25 microns, the multilayer film comprising:
    an adhesion-enhancing optical-matching layer deposited directly on a supporting surface and having a thickness of not more than 60 nm;
    a metallic conduction layer deposited directly on the adhesion-enhancing optical-matching layer and having a thickness of at least three and not more than 60 nm; and
    an anti-reflective overcoat layer comprising an oxide and deposited directly on the metallic conduction layer, the overcoat layer having a thickness of at least 3 and not more than 120 nm.

2. A multilayer electrically conducting thin film having an optical-transparency of at least 75% for at least a selected band of wavelengths between 400 nm and 25 microns and an electrical sheet resistance of no more than 5 Ohm/sq, the multilayer film comprising:
    an adhesion-enhancing optical-matching layer deposited directly on a supporting surface;
    a metallic conduction layer deposited directly on the adhesion-enhancing optical-matching layer; and
    an anti-reflective overcoat layer comprising silicon and an oxide of silicon, the overcoat layer deposited directly on the metallic conduction layer, and wherein the oxidation level of silicon in the overcoat layer increases with distance from the metallic conduction layer.

* * * * *